United States Patent [19]

Preiser

[11] Patent Number: 5,387,776
[45] Date of Patent: Feb. 7, 1995

[54] METHOD OF SEPARATION OF PIECES FROM SUPER HARD MATERIAL BY PARTIAL LASER CUT AND PRESSURE CLEAVAGE

[75] Inventor: Tatyana L. Preiser, Worthington, Ohio

[73] Assignee: General Electric Company, Worthington, Ohio

[21] Appl. No.: 60,459

[22] Filed: May 11, 1993

[51] Int. Cl.$^6$ ............................................. B23K 26/00
[52] U.S. Cl. ............................................. 219/121.72
[58] Field of Search ............ 219/121.6, 121.67, 121.72, 219/121.85

[56] References Cited

U.S. PATENT DOCUMENTS

| | | | |
|---|---|---|---|
| 3,612,814 | 10/1971 | Houldcroft | 219/121.67 |
| 3,629,545 | 12/1967 | Lumley et al. | 219/121.72 |
| 4,169,976 | 10/1979 | Cirri | 219/121.72 |
| 4,191,938 | 3/1980 | Gow, 3rd et al. | 338/195 |
| 4,224,101 | 9/1980 | Tijburg et al. | 156/643 |
| 4,248,369 | 2/1981 | Clausen | 219/121.72 |
| 4,336,439 | 5/1982 | Sasnett et al. | 219/121.68 |
| 4,401,876 | 8/1983 | Cooper | 219/121.69 |
| 4,467,168 | 8/1984 | Morgan et al. | 219/121.67 |
| 4,467,172 | 8/1984 | Ehrenwald et al. | 219/121.68 |
| 4,625,093 | 11/1986 | Chryssolouris | 219/121.69 |
| 4,682,003 | 7/1987 | Minakawa et al. | 219/121.72 |
| 4,970,368 | 11/1990 | Yamazaki et al. | 219/121.85 |
| 5,012,067 | 4/1991 | Sato et al. | 219/121.72 |
| 5,132,505 | 7/1992 | Zonneveld et al. | 219/121.6 |
| 5,138,130 | 8/1992 | Islam et al. | 219/121.6 |
| 5,138,131 | 8/1992 | Nishikawa et al. | 219/121.67 |
| 5,149,938 | 9/1992 | Winston et al. | 219/121.69 |
| 5,168,143 | 12/1992 | Kobsa et al. | 219/121.72 |

Primary Examiner—C. L. Albritton

[57] ABSTRACT

This invention relates to a method of separating at least one piece from a super hard material plate having top and bottom surfaces, comprising providing a laser capable of cutting said super hard material plate; making a cut with said laser through the top surface of said plate, said cut defining the shape of the piece to be separated and being to a depth which is less than the overall thickness of said plate; and separating said piece from said plate by applying an effective amount of pressure to said plate along the line of said cut to separate the uncut portion of said plate adjacent said cut.

10 Claims, 2 Drawing Sheets

METHOD OF SEPARATION OF PIECES FROM SUPER HARD MATERIAL BY PARTIAL LASER CUT AND PRESSURE CLEAVAGE

BACKGROUND OF THE INVENTION

1. Field of the Invention

This invention relates to a method for separating pieces from a super hard material plate by partially cutting the plate with a laser along the top of the plate and then subsequently cleaving the uncut portion by applying pressure to the plate along the line of the cut. More particularly, the invention relates to the separation of diamond devices, especially heat sinks for semiconductor devices, from diamond plates.

2. Description of the Prior Art

Lasers have been used to cut, scribe and etch various materials. U.S. Pat. No. 5,168,143 describes the cutting of metal plates with a laser. The laser cutting of glass is described in U.S. Pat. Nos. 4,467,168 and 4,682,003. The cutting and machining of ceramics with a laser are described in U.S. Pat. No. 4,169,976 and 5,138,130.

Lasers have also been effective in the cutting or scribing of super hard materials such as diamonds. U.S. Pat. No. 4,467,172 and 5,149,938 disclose the inscribing of diamonds with lasers. U.S. Pat. No. 5,012,067 discloses a method for cutting synthetic diamond workpieces.

Its hardness, thermal and electrical properties have made diamond useful in a variety of industrial applications. The high heat conductance and excellent electrical insulation properties of natural and synthetic diamond make it ideal for use as heat sinks for electronic components.

Presently the manufacture of diamond based heat sinks as well as other diamond based devices involves forming a plurality of the devices on a synthetic diamond plate and separating the individual devices from the plate. The synthetic diamond may be formed by a high pressure/high temperature method (HP/HT) or by a low pressure chemical vapor deposition (CVD) method. The individual devices are separated from the plate by cutting through the entire thickness of the plate with a laser.

This method of separating the devices from the plate presents two problems. First, as the diamond is cut by the laser graphite deposits are left on the walls of the cut. Graphite is an electrical conductor which when deposited on the cut walls tends to induce electrical conductivity between features of the device which are designed to be electrically isolated. Additionally, there may occur electrical conductance between the top and bottom surfaces of the device. Both situations lead to an increase in device failure because of the difficulty in removing the graphite.

Second, the devices are handled manually after cutting because of the difficulty of automating the cleaning and processing of the individual devices. This leads to a process that is slow, inefficient, and labor intensive. Also, additional higher yield loss occurs due to damage from increased handling.

Therefore, it is desirable to provide a method of separating pieces from diamond and other super hard material plates without compromising the inherent properties of the material. Moreover, a method of separating is desired which allows automation of the entire manufacturing process.

U.S. Pat. No. 4,248,369 discloses a method for laser cutting of ceramic tubing. The laser is use to drill holes at intervals around the circumference of the tubing to create a line of weakness. The tubing is then broken along the line of weakness.

U.S. Pat. No. 4,224,101 discloses a method of manufacturing semiconductor devices by partially laser cutting a disc of semiconductor material, upon which is disposed a plurality of devices. The debris from the cut is removed by preferential etching and the devices are separated from the disc.

SUMMARY OF THE INVENTION

This invention relates to a method of separating at least one piece from a super hard material plate having top and bottom surfaces, comprising providing a laser capable of cutting said super hard material plate; making a cut with said laser through the top surface of said plate, said cut defining the shape of the piece to be separated and being to a depth which is less than the overall thickness of said plate; and separating said piece from said plate by applying an effective amount of pressure to said plate along the line of said cut to separate the uncut portion of said plate adjacent said cut.

DESCRIPTION OF THE PREFERRED EMBODIMENTS

As used in the specification and appended claims, the use of the term "super hard" refers to materials having a hardness of about 10 or more on the Mohs hardness scale. (See Kirk-Othmer *Concise Encyclopedia of Chemical Technology* 3ed. p. 2.) Examples of such super hard materials include natural or synthetic diamond and cubic boron nitride (CBN).

The super hard material plate provided has top and bottom surfaces. In one embodiment the top and bottom surfaces are flat and parallel.

A preferred super hard material plate is diamond plate. Particularly preferred is CVD diamond plate. CVD diamond plate is prepared by low pressure growth of the diamond from a vapor phase.

Two techniques are generally used to prepare CVD diamond. The "heated filament method" introduces a dilute mixture of a hydrocarbon gas (usually methane) and hydrogen into a reactor evacuated to about 50 mbar. The hydrocarbon content is from about 0.1 to about 2.5% of the total gas mixture. The gas is passed over a tungsten or tantalum wire or mesh heated to about 1750° to about 2400° C. The gas mixture disassociates and diamond forms on a heated substrate placed 5 to about 15 mm from the hot filament. The substrate is kept at a temperature of about 500 to about 1100° C and is heated by radiation from the filament or by a separate substrate heater such as a Molybdenum resistance heated boat.

The "plasma jet" method uses a plasma jet in lieu of a heated filament to dissociate the gas molecules. This method allows the plasma to be scanned so as to coat a larger substrate area. Three basic plasma systems are utilized: microwave, inductively or capacitively coupled (RF) and d.c. (See *C&E News* May 15, 1989, P. Bachmann, p. 24–39).

The lasers provided are those capable of cutting a super hard material such as diamond or CBN. A preferred laser of this type is a frequency doubled Nd:YAG laser which generates an energy beam with a wavelength of 532 nm with an output of about 3 kW when operated in a Q-switched pulse mode.

Figure 3:
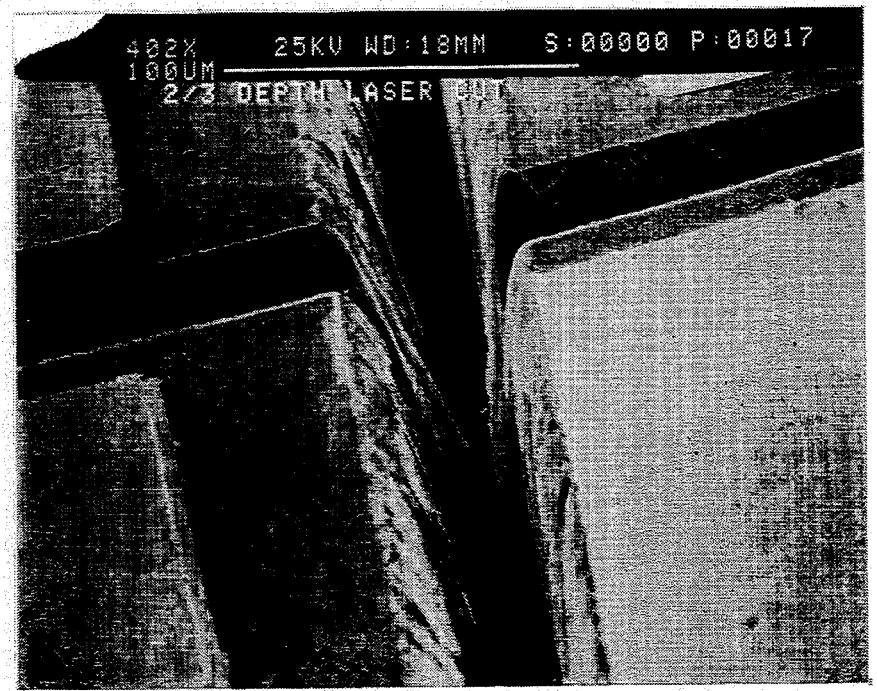
FIGS. 3 and 4 are photographs of CVD diamond plates laser cut to a depth of about two-thirds of the overall thickness of the plate.
Figure 4:

The laser beam is positioned so as to make a cut which is preferably perpendicular to the top surface of the plate to be cut and results in straight edge pieces being produced upon separation. Means known in the art are provided for moving the laser beam over the plate to make the required cut. The cut is made in a manner to define the shape of the piece to be separated. That is a square cut for a square piece, rectangle cut for a rectangular piece and so on. It is understood that cuts of pieces on the edge of the plate will only partially define the shape of the piece. The plate edge will define the remainder of the piece. The depth of the cut must be sufficient to allow easy separation of the piece from the plate. Additionally, the cut must be made in a manner to maintain structural integrity of the whole plate during cleaning and processing subsequent to the laser cutting. Moreover, the partial cut depth should be effective to allow separation without damage to the piece which would cause rejection of the final product. In one embodiment the cut is made to a depth of about two-thirds of the overall thickness of the plate. FIGS. 3 and 4 illustrate a laser cut of about two-thirds of the overall thickness.

In one embodiment the cut is made to a depth effective to result in a surface roughness (Ra) of the uncut cleaved portion of the plate upon cleavage of less than or about equal to 5 $\mu$m. Ra is the arithmetic average of the absolute distances of all profile points from the mean line. The mean line is normally the line of the ideal surface.

The piece is separated by application of pressure to the plate along the cut. In one embodiment the pressure is applied to the bottom of the plate. The separation step may be performed manually, but more preferably is automated or semiautomated utilizing means known in the art which will allow application of pressure along the line of the cut to cleave, break or separate the piece from the plate.

In one embodiment the super hard material plate is CVD diamond and the pieces that are separated are CVD diamond devices. In one embodiment the CVD diamond devices are heat sinks. In another embodiment the CVD diamond devices are tool blanks. The tool blanks may be used for cutting tools, drill bits, dressing tools and wear parts. The CVD diamond may exist as grown, or be lapped on either side, or be polished on either side or both.

Also contemplated in this invention is a method of making CVD diamond devices, more particularly, CVD diamond heat sinks employing the separation method disclosed herein. It will be appreciated that the CVD diamond device may be coated and patterned with material such as various metals, tantalum nitride or various conductive and resistive coatings to build passive electronic circuits before cutting. Also, the CVD diamond may serve as a substrate for active electronic circuits by doping it with elements such as chlorine, selenium or sulfur.

A CVD diamond plate with at least one CVD diamond device formed thereon is provided. A partial cut is made according to the method of this invention. The partially cut plate is then cleaned, tested, inspected and processed for final separation.

The cleaning step involves solvent and plasma cleaning of the plate. The solvent cleaning of the plate is much easier and faster than in previous processes. This is because the cleaning is done on whole plates rather than on individual separated pieces. As a result, the solvent cleaning step is much easier to automate. The plasma cleaning step uses conventional technology known in the art. (See Kirk-Othmer *Concise Encyclopedia of Chemical Technology* 3ed. p. 900–902.) The time to perform this step is shortened as a result of the method of this invention because contamination is lessened. This is especially true with respect to removal of contamination caused by conductive graphite deposition during laser cutting. The deposited graphite has in the past proved to be difficult to remove. Since there is a smaller laser cutting zone there is less graphite deposited and, therefore, less to remove.

The processing step includes electrical and dimensional testing of devices and selecting pieces for rejection after final separation. It is possible to use automatic or semiautomatic testing of the pieces because they are intact as a group on the plate.

After processing the pieces are separated from the plate with the rejected dies easily discarded.

The use of the method of this invention in making CVD diamond devices provides for top to bottom electrical isolation if the plate is nonconductive because part of the thickness of the CVD diamond device has never been contaminated with graphite from laser cutting. Further processing steps are greatly enhanced. Cleaning time is dramatically reduced from about 250 pieces in about 4–6 hours to about 2000 pieces in about 4–6 hours. The testing step is greatly simplified by automation with overall throughput increased. Moreover, risk of scratching, contamination and other damage to the pieces is significantly reduced because of the faster and easier automated processing.

The following example illustrates the use of the invention in cutting CVD diamond heat sinks from a CVD diamond plate.

EXAMPLE

Figure 1:
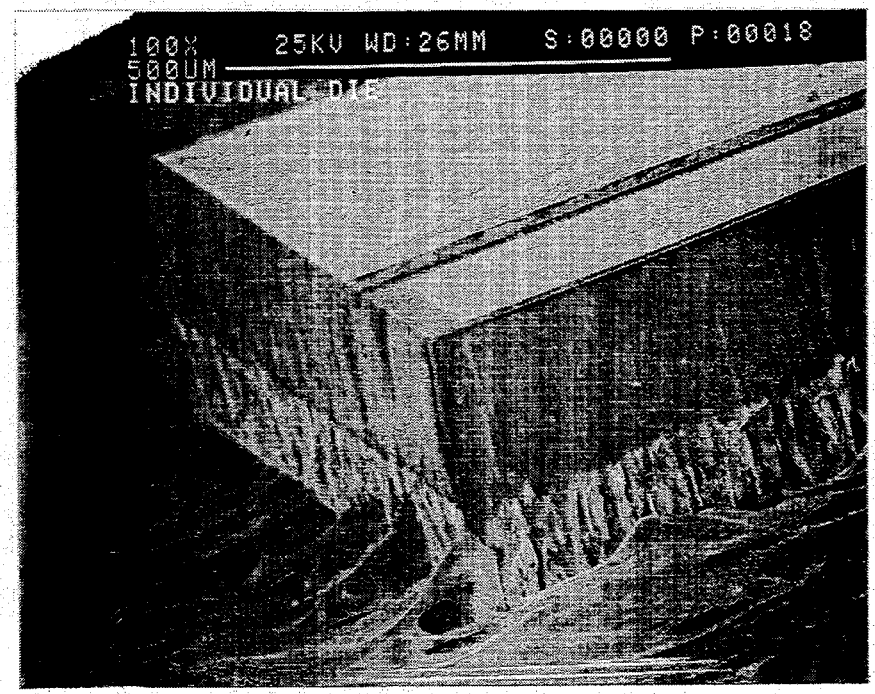
FIGS. 1 and 2 are photographs of CVD diamond heat sinks partially laser cut and cleaved according to the invention.
Figure 2:
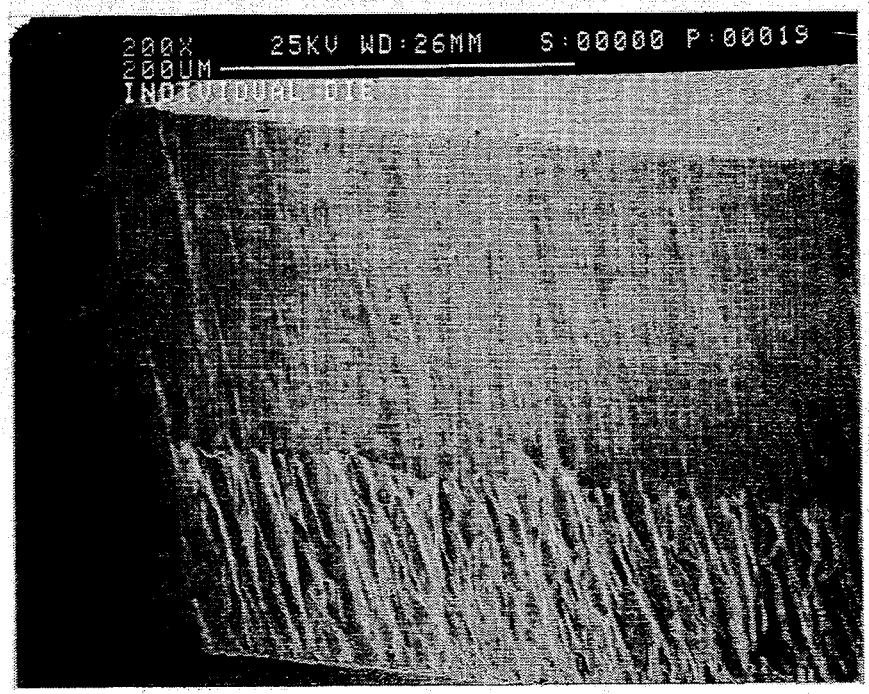

A CVD diamond heat sink is separated from a CVD diamond plate according to the method of this invention. The plate is cut with a frequency doubled Nd:YAG laser in the Q-switch mode at a power output of about 3 kW to a depth of about two-thirds of the overall thickness of the plate. The heat sink is separated from the plate by pressure application to the bottom side of the plate. FIGS. 1 and 2 show the resultant individual heat sinks. The cut and uncut cleaved ends of the separated heat sink are tested for surface roughness with a Rodenstock laser profilometer system with Stylus filter (Nf) of 10 $\mu$m and wave filter (Lc) of 0.25 min. The results follow in Table I.

TABLE I

| | Ra ($\mu$m) | |
|---|---|---|
| 1 | .46 | Laser cut end |
| 2 | .421 | |
| 3 | .504 | |
| 4 | .652 | |
| 5 | 1.17 | |
| 6 | 1.63 | |
| 7 | 1.88 | |
| 8 | 2.4 | |

TABLE I-continued

| | Ra (μm) | |
|---|---|---|
| 9 | 2.39 | |
| 10 | 2.58 | |
| 11 | 2.48 | |
| 12 | 2.38 | |
| 13 | 2.31 | |
| 14 | 2.19 | |
| 15 | 2.01 | Cleaved end |

The results indicate that the surface roughness (Ra) is less than 5 μm.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

I claim:

1. A method of separating at least one piece from a super hard material plate having top and bottom surfaces, comprising:
   providing a laser capable of cutting said super hard material plate; making a cut with said laser through the top surface of said plate, said cut defining the shape of the piece to be separated and being to a depth which is less than the overall thickness of said plate; and
   separating said piece from said plate by applying an effective amount of pressure to the bottom side of said plate along the line of said cut to separate the uncut portion of said plate adjacent said cut.

2. The method of claim 1 wherein said super hard material is a CVD diamond plate.

3. The method of claim 2 wherein said piece is a CVD diamond device.

4. The method of claim 3 wherein said CVD diamond device is a heat sink.

5. The method of claim 3 wherein said CVD diamond device is a tool blank.

6. A method of separating at least one piece from a super hard material plate having top and bottom surfaces, comprising:
   providing a laser capable of cutting said super hard material plate; making a cut with said laser through the top surface of said plate, said cut defining the shape of the piece to be separated and being to a depth which is less than the overall thickness of said plate said cut made to a depth of about two-thirds of the overall plate thickness; and separating said piece from said plate by applying an effective amount of pressure to said plate along the line of said cut to separate the uncut portion of said plate adjacent said cut.

7. A method of making a CVD diamond device comprising:
   providing a CVD diamond plate having top and bottom surfaces;
   forming the pattern of said diamond device on said plate;
   providing a laser capable of cutting said plate;
   making a cut with said laser through the top surface of said plate, said cut defining the shape of said device and being to a depth which is less than the overall thickness of said plate;
   cleaning said plate for final separation; and
   separating said device from said plate by applying an effective amount of pressure to the bottom surface of said plate along the line of said cut to separate the uncut portion of said plate adjacent said cut.

8. The method of claim 7 wherein the cut is made to a depth of about two-thirds of the plate thickness.

9. The method of claim 7 wherein said device is a CVD diamond heat sink.

10. The method of claim 7 wherein said device is a CVD diamond tool blank.

* * * * *